United States Patent
Kamata et al.

(10) Patent No.: US 11,307,353 B2
(45) Date of Patent: Apr. 19, 2022

(54) END DEVICE OF OPTICAL WAVEGUIDE AND OPTICAL FILTER

(71) Applicant: DENSO CORPORATION, Kariya (JP)

(72) Inventors: Yuki Kamata, Kariya (JP); Toshihiro Oda, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/009,943

(22) Filed: Sep. 2, 2020

(65) Prior Publication Data

US 2021/0063641 A1 Mar. 4, 2021

(30) Foreign Application Priority Data

Sep. 4, 2019 (JP) .............................. JP2019-161330

(51) Int. Cl.
| | |
|---|---|
| *G02B 6/122* | (2006.01) |
| *G02B 6/125* | (2006.01) |
| *G02B 6/12* | (2006.01) |

(52) U.S. Cl.
CPC .......... *G02B 6/1228* (2013.01); *G02B 6/125* (2013.01); *G02B 2006/12104* (2013.01); *G02B 2006/12109* (2013.01); *G02B 2006/12121* (2013.01)

(58) Field of Classification Search
None
See application file for complete search history.

(56) References Cited

U.S. PATENT DOCUMENTS

| | | | | |
|---|---|---|---|---|
| 7,792,399 | B2 * | 9/2010 | Kato | G02B 5/003 385/18 |
| 9,946,023 | B2 * | 4/2018 | Dumais | G02B 6/136 |
| 10,031,310 | B2 * | 7/2018 | Yamazaki | H01S 5/142 |
| 10,359,569 | B2 * | 7/2019 | Dumais | G02B 6/122 |
| 10,527,792 | B2 * | 1/2020 | Dumais | G02B 6/122 |
| 10,527,793 | B1 * | 1/2020 | Liu | G02B 5/1809 |
| 2003/0165296 | A1 | 9/2003 | Bouda | |
| 2008/0232409 | A1 * | 9/2008 | Yamazaki | G02B 6/12007 372/20 |
| 2009/0185776 | A1 | 7/2009 | Kato | |
| 2017/0038532 | A1 * | 2/2017 | Dumais | G02B 6/131 |
| 2017/0254976 | A1 | 9/2017 | Yamazaki | |
| 2017/0315296 | A1 * | 11/2017 | Dumais | G02B 6/134 |

(Continued)

FOREIGN PATENT DOCUMENTS

| | | |
|---|---|---|
| JP | 3070016 B2 | 7/2000 |
| JP | 3666729 B2 | 6/2005 |

(Continued)

*Primary Examiner* — Rhonda S Peace
(74) *Attorney, Agent, or Firm* — Posz Law Group, PLC

(57) ABSTRACT

A first optical waveguide is formed on a semiconductor substrate in such a way that the first optical waveguide is surrounded by clad layers. An outside portion of the first optical waveguide is formed as a terminator, which includes a taper portion and a bending structure portion. The taper portion has a width, which is gradually reduced in a direction to a forward end of the first optical waveguide. The taper portion coverts a light confinement condition from a strong condition to a weak condition in the direction to the forward end of the first optical waveguide. The bending structure portion has an arc shape extending from an outside end of the taper portion on a plane parallel to a surface of the semiconductor substrate.

17 Claims, 11 Drawing Sheets

(56) References Cited

U.S. PATENT DOCUMENTS

2017/0322377 A1* 11/2017 Dumais ................. G02B 6/136
2020/0144782 A1*  5/2020 Oda .................... H01S 3/08027
2021/0063641 A1*  3/2021 Kamata ................. G02B 6/125

FOREIGN PATENT DOCUMENTS

| JP | 2010-186132 A | 8/2010 |
| JP | 2012-048036 A | 3/2012 |
| JP | 5416003 B2 | 2/2014 |

* cited by examiner

END DEVICE OF OPTICAL WAVEGUIDE AND OPTICAL FILTER

CROSS REFERENCE TO RELATED APPLICATION

This application is based on Japanese Patent Application No. 2019-161330 filed on Sep. 4, 2019, the disclosure of which is incorporated herein by reference.

FIELD OF TECHNOLOGY

The present disclosure relates to an end device of an optical waveguide and an optical filter using the same, according to which unnecessary optical reflection is suppressed in the optical waveguide.

BACKGROUND

Various kinds of optical filters, each of which is formed on a semiconductor substrate and each of which is wavelength tunable, as well as various kinds of laser light sources using the optical filters are known in the art. For example, one of the laser light sources is known in the art, which includes an optical filter having two ring resonators. In the laser light source of this kind, when outgoing light from a semiconductor optical amplifier (SOA) is transmitted via an optical waveguide, the outgoing light is inputted to each of the ring resonators. The light is reflected at a reflecting portion, such as, a loop mirror provided at an end of the optical wave guide and such reflected light returns to the SOA. A strong resonant condition is produced between an end-face reflecting mirror of the SOA and the loop mirror by use of Vernier effect, wherein the outgoing light of the SOA is reflected at the reflecting portion (such as, the loop mirror or the like) via the two ring resonators and the reflected light returns to the SOA. The strong light based on a laser oscillation is emitted from the end-face reflecting mirror of the SOA, wherein the strong light has a wavelength with which the strong resonant is generated. The SOA functions as a laser light source. In the present disclosure, the outgoing light from the SOA to the optical waveguide is referred to as "an internal outgoing light", while the outgoing light from the SOA to an outside thereof is referred to as "an external outgoing light".

In the laser light source of the above prior art having the optical filter, a terminator is provided at an end of the optical waveguide as an end device of the optical waveguide in order to suppress unnecessary optical reflection at the end of the optical waveguide, which guides the light to each of the ring resonators. In other words, the unnecessary light is discharged by the terminator from the end of the optical waveguide to a surrounding clad layer.

In one of the prior arts, a forward end portion of an optical waveguide is inclined with respect to a remaining part of the optical waveguide, which is located at a position more inside than the forward end portion, and the forward end portion has a taper shape which is configured in such a way that a width of the optical waveguide is gradually reduced in a direction to a forward end. The forward end portion of the optical waveguide works as a terminator. It is possible that reflection return of the light at the forward end portion can be decreased to some extent, when the forward end portion is inclined with respect to the remaining part of the optical waveguide. A weak condition of light confinement is generated, when the forward end portion is formed in the taper shape. It is thereby possible to suppress the unnecessary optical reflection to some extent by discharging the light from the forward end.

In one of the other prior arts, a spiral shape is proposed as the terminator to be formed at the forward end portion of the optical waveguide. In such a prior art, a curvature of the forward end portion having the spiral shape is set at such a value that bending loss is generated. The incoming light inputted to the forward end portion of the spiral shape is dampened and thereby the unnecessary optical reflection is suppressed.

Even in a case that a taper portion is formed having the width, which is reduced in the direction to the forward end, a minimum width of the optical waveguide is decided by restrictions of the semiconductor process. Therefore, it is difficult to make the width at the forward end sufficiently small. It is difficult to make a light confinement condition sufficiently weak. As a result, a small amount of light is inevitably reflected. In a terminator for a laser resonator, which is used as a laser light source, even such a small amount of light reflection cannot be neglected. Unintentional oscillation may be caused by such a reflected light.

In a case that a forward end portion is formed in a spiral shape, a curvature radius is gradually reduced from such a curvature radius at which a bending loss is not generated to such a curvature radius at which the bending loss is increased. An occupying space may become large in such a structure. In particular, in a case that the optical waveguide is made of such waveguide material, for example, silicon nitride film, wherein a difference of a refractive index between the waveguide material and clad material is small, the curvature radius of the waveguide having no bending loss has a value of 30 to 100 μm. As a result, the occupying space becomes larger, which cannot be neglected. Therefore, a semiconductor substrate, on which an integrated circuit for an optical filter is formed, may become large.

SUMMARY OF THE DISCLOSURE

The present disclosure is made in view of the above point. It is an object of the present disclosure to provide an end device of an optical waveguide and an optical filter using the end device, according to which optical reflection can be effectively suppressed.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION OF THE EMBODIMENTS

Figure 1:
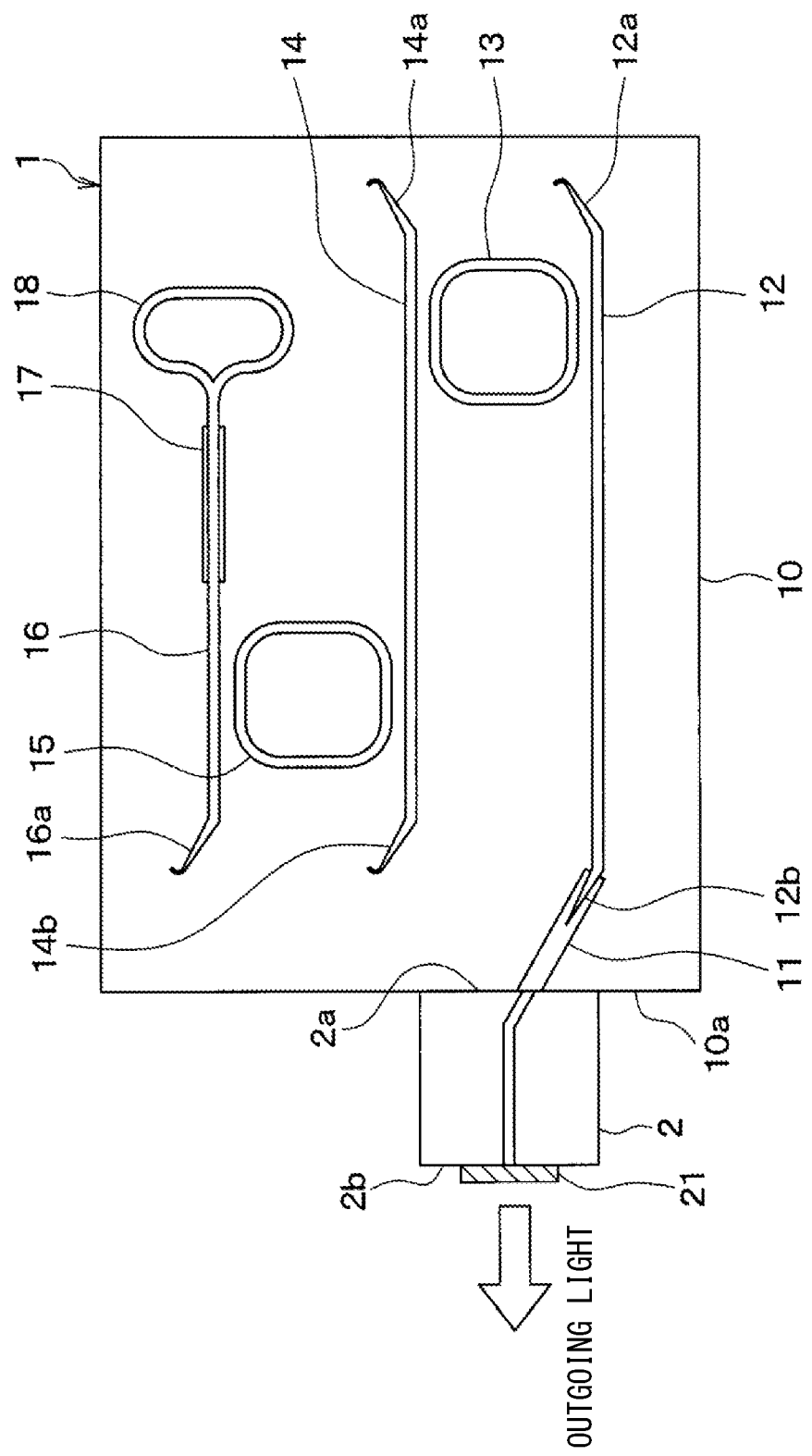
FIG. 1 is a schematic view showing an outline of a structure of a laser light source according to a first embodiment of the present disclosure.

The present disclosure will be explained hereinafter by way of multiple embodiments and/or modifications with reference to the drawings. The same reference numerals are given to the same or similar structures and/or portions in order to avoid repeated explanation.

First Embodiment

A first embodiment will be explained with reference to FIGS. 1 to 9. In the present embodiment, a laser light source using an optical filter having a terminator as an end device of an optical waveguide will be explained.

As shown in FIG. 1, the laser light source includes the optical filter 1 and an SOA (Semiconductor Optical Amplifier) 2. The laser light source emits an internal outgoing light from the SOA 2 to the optical filter 1 and produces a strong light in a resonant condition, which is generated in the optical filter 1 and the SOA 2. Then, the laser light source emits the strong light as an external outgoing light from the SOA 2 to an outside of the laser light source.

The optical filter 1 is formed by, for example, a semiconductor process applied to a semiconductor substrate 10. More exactly, the semiconductor substrate 10, which forms the optical filter 1, includes a spot-size converter (SSC) 11, a first optical waveguide 12, a first ring resonator 13, a second optical waveguide 14, a second ring resonator 15, a third optical waveguide 16, a modulator 17, a loop mirror 18 and so on.

The SSC 11 is an optical spot-size converter. The SSC 11 fits a mode diameter of the SOA 2 to that of the first optical waveguide 12 and the second optical waveguide 14. One end of the SSC 11 is exposed to the outside of the semiconductor substrate 10 at its end surface 10a, while the other end of the SSC 11 is connected to the first optical wave guide 12. For example, the SSC 11 is formed in a taper shape, the mode diameter of which is gradually increased in a direction from the first optical waveguide 12 to the SOA 2. The other end of the SSC 11, which is located on a side of the first optical waveguide 12, is inclined to a longitudinal direction of the first optical waveguide 12 by a predetermined angle in order to prevent reflection.

Each of the first optical waveguide 12, the second optical waveguide 14 and the third optical waveguide 16 has a function for transmitting the internal outgoing light of the SOA 2 from the SSC 11. Each of the optical waveguides 12, 14 and 16 straightly extends and each of them is arranged in a line form in parallel to one another. In each of the optical waveguides 12, 14 and 16, an inside portion (a main waveguide portion) other than outside portions at both longitudinal ends of the inside portion has a width and a thickness, which are the same to one another. Each of the inside portions (the main waveguide portions) of the first to the third optical waveguides 12, 14 and 16 has a constant cross sectional area in its longitudinal direction. The first optical waveguide 12 transmits the internal outgoing light to the first ring resonator 13 and transmits the internal outgoing light returning from the first ring resonator 13 to the SOA 2. The second optical waveguide 14 transmits the internal outgoing light from the first ring resonator 13 to the second ring resonator 15 and transmits the internal outgoing light returning from the second ring resonator 15 to the first ring resonator 13. The third optical waveguide 16 transmits the internal outgoing light from the second ring resonator 15 to the loop mirror 18 and transmits the internal outgoing light returning from the loop mirror 18 to the second ring resonator 15.

Figure 3A:
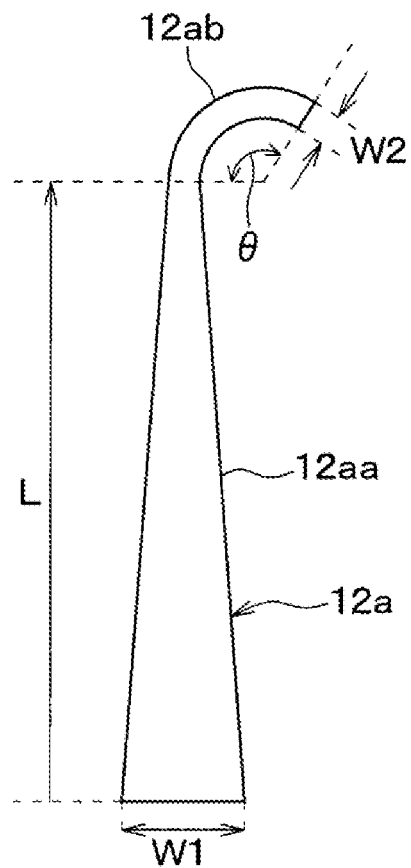
FIG. 3A is a schematic plan view showing an upper-side shape of a terminator.

Terminators 12a, 14a, 14b and 16a are respectively provided at the longitudinal end of the inside portion of the first optical waveguide 12 opposite to the SSC 11, at both longitudinal ends of the inside portion of the second optical waveguide 14, and at the longitudinal end of the inside portion of the third optical waveguide 16 opposite to the loop mirror 18. Unnecessary light transmitted from each of the optical waveguides is discharged to an outside of the respective optical waveguides by each of the terminators 12a, 14a, 14b and 16a. Each outside portion of the optical waveguides, which works as the terminator 12a, 14a, 14b or 16a, extends in a direction inclined by a predetermined angle to the longitudinal direction of each inside portion of the optical waveguide and it has a taper shape gradually shrinking to its forward end, in order to avoid a situation that the unnecessary light is reflected and such reflected light is transmitted again through the inside portion of the optical waveguide. As shown in FIG. 3A, in each of the terminators 12a, 14a, 14b and 16a, the outside portion is bent so that the light transmitted to the outside portion is discharged to a surrounding clad layer and reflection of the unnecessary light is suppressed. A detailed structure of those terminators 12a, 14a, 14b and 16a will be explained below. In each of the terminators 12a, 14a, 14b and 16a, each outside portion is bent at the longitudinal end of the inside portion so that each of the terminators 12a, 14a, 14b and 16a is inclined to the inside portion of the optical waveguide. The forward end portion has a curved portion, which has a constant width having a predetermined curvature radius. In a straight portion of the outside portion, that is a portion between the curved portion and the longitudinal end of the inside portion of the optical waveguide, a width thereof is gradually reduced from the inside portion to the curved portion.

The outside portion of the first optical waveguide 12 (a left-hand side portion), which is connected to the SSC 11, extends in a direction inclined to the longitudinal direction of the inside portion of the first optical waveguide 12 by the predetermined angle. The outside portion (the left-hand side portion) of the first optical waveguide 12 includes a taper portion 12b connected to the SSC 11, so that the reflection is suppressed and thereby the light can be effectively transmitted to the SSC 11.

Each of the first ring resonator 13 and the second ring resonator 15 is a resonator, which produces a transmission spectrum having a predetermined free spectral distance (hereinafter, the FSR), when the internal outgoing light is inputted thereto. Each of the first ring resonator 13 and the second ring resonator 15 has a boundary length different from each other. Therefore, each of the first ring resonator 13 and the second ring resonator 15 produces the transmission spectrum having the FSR different from each other.

A wavelength, at which the transmission spectrum produced by the first ring resonator 13 overlaps with the transmission spectrum produced by the second ring resonator 15, becomes a first peak which is highest in the transmission spectrum of the double ring, that is, a synthetic spectrum of the transmission spectra produced by the first and the second ring resonators 13 and 15. A longitudinal mode is chosen by the first peak for a Fabry-Perot cavity, which is formed between a reflecting mirror 21 and the loop mirror 18. A laser oscillation is generated to produce the strong light, which is emitted as the external outgoing light from the SOA 2 to the outside of the laser light source.

The first ring resonator 13 is provided between the first optical waveguide 12 and the second optical waveguide 14 and located at a position separated from each of the first and the second optical waveguides 12 and 14 by a predetermined distance. However, the first ring resonator 13 is optically coupled to each of the first and the second optical waveguides 12 and 14. Therefore, when the internal outgoing light is transmitted from the first optical waveguide 12, the internal outgoing light is transmitted to the first ring resonator 13. The internal outgoing light transmitted to the first ring resonator 13 is further transmitted to the second optical waveguide 14.

In a similar manner, the second ring resonator 15 is provided between the second optical waveguide 14 and the third optical waveguide 16 and located at a position separated from each of the second and the third optical waveguides 14 and 16 by a predetermined distance. However, the second ring resonator 15 is optically coupled to each of the second and the third optical waveguides 14 and 16. Therefore, when the internal outgoing light is transmitted from the second optical waveguide 14, the internal outgoing light is transmitted to the second ring resonator 15. The internal outgoing light transmitted to the second ring resonator 15 is further transmitted to the third optical waveguide 16.

Figure 2:
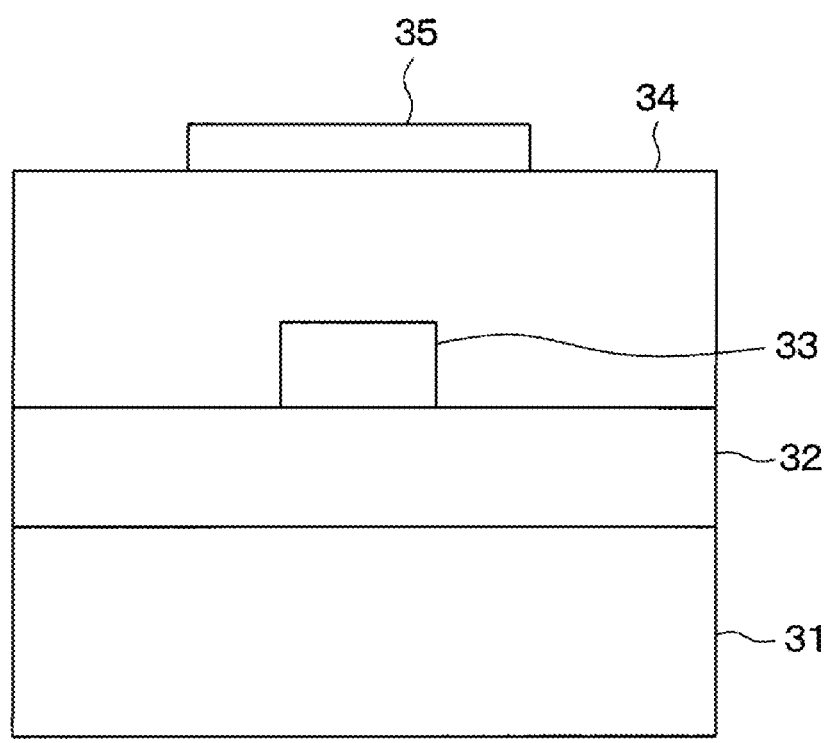
FIG. 2 is a schematic cross-sectional view showing a part of a first ring resonator.

As shown in FIG. 2 and explained below, a heater 35 is provided for each of the first and the second ring resonators 13 and 15. The FSR (the free spectral distance) of the transmission spectrum is intentionally changed, when each of the first and the second ring resonators 13 and 15 is heated by the heater 35.

Each of the first optical waveguide 12, the second optical waveguide 14 and the third optical waveguide 16 has the width, which is the same to one another. Each of the first ring resonator 13 and the second ring resonator 15 is formed with four corners of a rectangular shape, which is divided into a quadrant. A width of each of the first and the second ring resonators 13 and 15 is made to be the same to that of each of the first, the second and the third optical waveguides 12, 14 and 16. Each of the first and the second ring resonators 13 and 15 is optically coupled to each of the first, the second and the third optical waveguides 12, 14 and 16 respectively at each of straight portions of the first ring resonator 13, which are respectively opposed to the first optical waveguide 12 and the second optical waveguide 14, or at each of straight portions of the second ring resonator 15, which are respectively opposed to the second optical waveguide 14 and the third optical waveguide 16. A length of such a straight portion is set at a predetermined value in view of optical coupling efficiency. A distance between the first ring resonator 13 and the first optical waveguide 12 as well as a distance between the first ring resonator 13 and the second optical waveguide 14 (a waveguide gap) is likewise set at a predetermined value in view of the optical coupling efficiency.

FIG. 2 shows a cross-sectional structure of the first ring resonator 13. The first ring resonator 13 includes a supporting substrate 31, an under-clad layer 32, a core layer 33, an over-clad layer 34 and the heater 35, which are built up with one another.

The supporting substrate 31 is composed of a silicon substrate or the like, which has a thickness of, for example, 725 µm. The under-clad layer 32 is composed of an insulating film, such as, a silicon dioxide film ($SiO_2$), and formed on the supporting substrate 31 at a thickness of, for example, 2 µm. The core layer 33 is a portion for forming the optical waveguide of the first ring resonator 13 and is made of silicon or the like. An upper-side shape of the core layer 33 is patterned in such a shape corresponding to that of the first ring resonator 13. A width of the core layer 33 corresponds to the width of the first ring resonator 13. For example, the core layer 33 has a width of 0.40 µm and a thickness of 0.22 µm. The over-clad layer 34 is composed of the insulating film, such as the silicon dioxide film ($SiO_2$), and formed at a thickness of, for example, 3 µm in such a way that the over-clad layer 34 covers the core layer 33. The heater 35 is formed on the over-clad layer 34 at such a position corresponding to the core layer 33 and has a thickness of 0.12 µm. The heater 35 is made of heat generating material, such as, tantalum (Ta), titanium nitride (TiN), tantalum nitride (TaN) or the like, which heats the core layer 33 when electric power is supplied thereto.

The second ring resonator 15 has the same cross-sectional structure to that of the first ring resonator 13. Each of the first to the third optical waveguides 12, 14 and 16 has basically the same cross-sectional structure to that shown in FIG. 2, except for the heater 35. An SOI (Silicon On Insulator) substrate is used for each of the supporting layer 31, the under-clad layer 32 and the core layer 33. An active layer of the SOI substrate is patterned to form the core layer 33.

The modulator 17 modulates a phase of the internal outgoing light passing through the third optical waveguide 16. A phase modulator using thermos-optical effect, carrier-plasma effect, electro-optical effect or the like is used as the modulator 17. The modulator 17 may be provided not only for the third optical waveguide 16 but also for the first and the second optical waveguides 12 and 14.

The loop mirror 18 transmits the internal outgoing light transmitted from the third optical waveguide 16 in a loop shape and transmits it again to the third optical waveguide 16.

The SOA 2, which is composed of, for example, a III-V group semiconductor structure, is a light source for amplifying the light and emitting the same. One of surfaces of the SOA 2 (hereinafter, a first surface 2a) is attached to the end surface 10a of the semiconductor substrate 10. The SOA 2 is thereby connected to the optical filter 1 and integrally works therewith. The SOA 2 is connected to the end surface 10a via matching oil (not shown), ultraviolet-curing resin (not shown) or the like, in order that the SOA 2 is optically coupled to the first optical waveguide 12 at the first surface 2a.

Another surface 2b of the SOA 2, which is opposite to the first surface 2a and referred to as a second surface 2b, works as a light emitting surface of the external outgoing light. The reflecting mirror 21 is provided on the second surface 2b. The external outgoing light is emitted from the SOA 2 to the outside thereof through the reflecting mirror 21, while the internal outgoing light is reflected by the reflecting mirror 21 and it is sent to the optical filter 1. In the present embodiment, in which the internal outgoing light is reflected by the reflecting mirror 21, while the external outgoing light is emitted to the outside, a reflection ratio of the reflecting mirror 21 is about 1 to 10%. Electrodes (not shown) are provided in the SOA 2 and an optical output of the external outgoing light can be changed depending on an amount of electric current inputted to the SOA 2 via the electrodes.

As above, the laser light source is formed by combining the optical filter 1 to the SOA 2. The laser light source forms the Fabry-Perot cavity, according to which the internal outgoing light is reflected by the reflecting mirror 21 and the loop mirror 18. The resonant condition of the longitudinal mode is thereby produced between the reflecting mirror 21 and the loop mirror 18. More than one longitudinal mode is selected by the strong resonant condition of the first and the second ring resonators 13 and 15. The laser oscillation is generated at the wavelength, at which the strong resonant condition is produced. The strong light is emitted from the reflecting mirror 21 as an induced emission and outputted to the outside as the external outgoing light.

In the laser light source having the above optical filter 1, it is important to suppress unnecessary reflection of the light at the respective ends of the first optical waveguide 12, the second optical waveguide 14 and the third optical waveguide 16, each of which transmits the light to the first ring resonator 13 and the second ring resonator 15. Each of the terminators 12a, 14a, 14b and 16a is respectively provided at the end of the first optical waveguide 12 opposite to the SSC 11, at both ends of the second optical waveguide 14, and at the end of the third optical waveguide 16 opposite to the loop mirror 18. The light is discharged by those terminators 12a, 14a, 14b and 16a from the respective ends of the first, the second and the third optical waveguides 12, 14 and 16 to the surrounding clad layer, that is, the under-clad layer 32 and the over-clad layer 34.

A detailed structure of the terminators 12a, 14a, 14b and 16a will be explained hereinafter. In the present disclosure, only the structure of the terminator 12a will be explained. However, each of the other terminators 14a, 14b and 16a has the same structure to that of the terminator 12a.

The terminator 12a is provided at the longitudinal end of the inside portion (the main waveguide portion) of the first optical waveguide 12. The terminator 12a has the taper shape, the width of which is gradually decreased in the direction from the inside portion to the forward end portion. The forward end portion is bent in an arc shape on a plane parallel to a surface of the semiconductor substrate 10. As shown in FIG. 3A, the terminator 12a (the outside portion of the optical waveguide) includes a taper portion 12aa and a bending structure portion 12ab (that is, the forward end portion). In the taper portion 12aa of the terminator 12a, the width of the optical waveguide is gradually decreased from a first width "W1", which is equal to the width of the inside portion of the first optical waveguide 12. The bending structure portion 12ab has a second width "W2", which is smaller than the first width "W1", wherein the bending structure portion 12ab has the constant width (the second width "W2") for its entire length. In the present embodiment, the second width "W2" is set at such a minimum value, which is decided by restriction of a semiconductor process.

The width of the taper portion 12aa at its outside end is set at the second width "W2" equal to that for the bending structure portion 12ab, wherein the second width "W2" is set at the minimum value, which is decided by the restriction of the semiconductor process. However, it is not always necessary to make the second width "W2" to be the minimum value. Namely, while the width of the taper portion 12aa is gradually decreased from the first width "W1" to a smaller value (the second width "W2") in the direction to the outside end of the taper portion 12aa, the second width "W2" may be set at such a value larger than the minimum value decided by the restriction of the semiconductor process. In such a case, the width of the bending structure portion 12ab may be constant at the second width "W2". Alternatively, the width of the bending structure portion 12ab may be gradually reduced to the minimum value at an outermost end of the bending structure portion 12ab, which is opposite to an inside end connected to the taper portion 12aa.

Each of the width and the thickness of the inside portion of the first optical waveguide 12, the taper portion 12aa and the bending structure portion 12ab is respectively set at an appropriate value depending on a material of the first optical waveguide 12 (hereinafter, the waveguide material) and a material of the surrounding clad layers including the under-clad layer 32 and the over-clad layer 34 (hereinafter, the clad material).

Figure 3B:
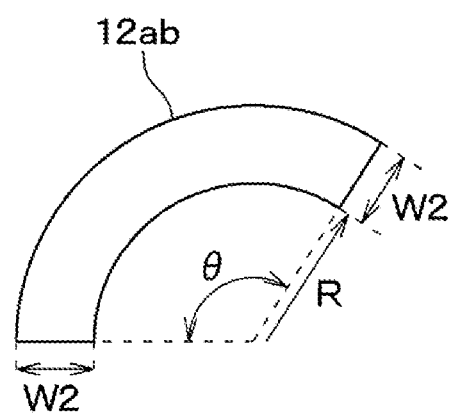
FIG. 3B is schematic plan view showing a detailed structure of a bending structure portion of the terminator.
Figure 4A:
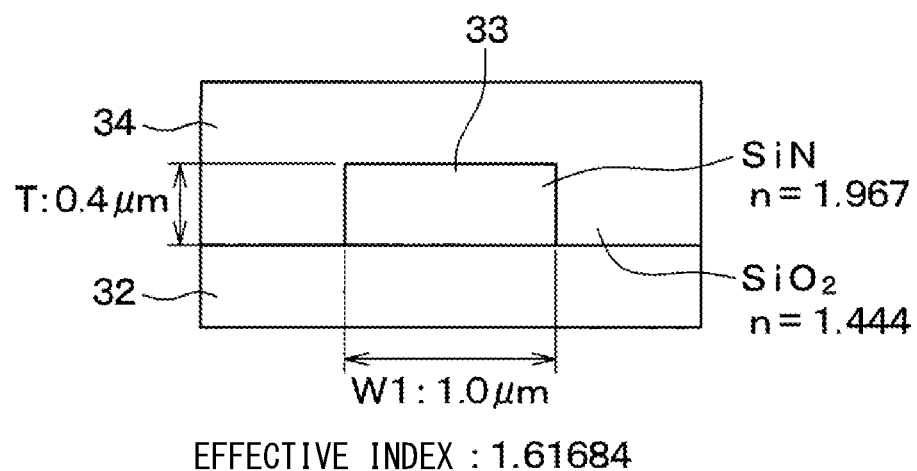
FIG. 4A is a schematic cross-sectional view showing a first optical waveguide and the terminator at a position having a first waveguide width "W1"
Figure 4B:
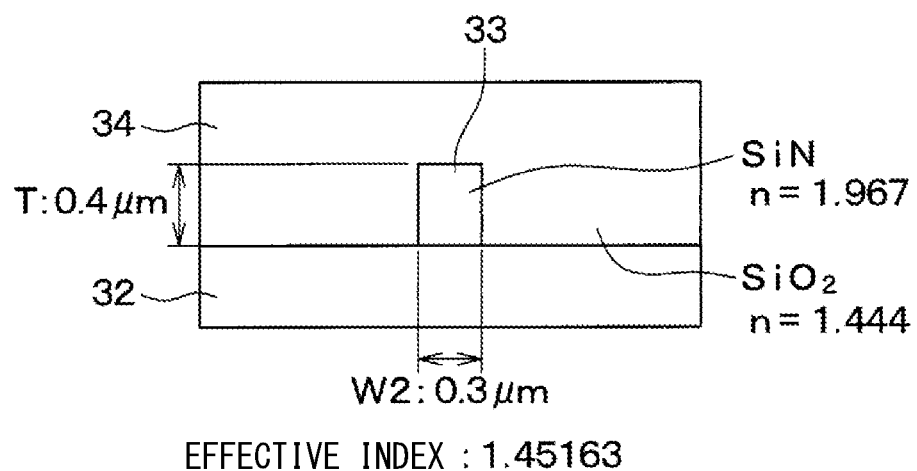
FIG. 4B is a schematic cross-sectional view showing the terminator at a position having a second waveguide width "W2"

For example, in a case that the waveguide material is SiN (Silicon Nitride) and the clad material is SiO$_2$ (Silicon Dioxide), dimension of each portion in FIG. 3A is set at the value in the following way. The first width "W1", which is the widest in the first optical waveguide 12 and the taper portion 12aa, is set at 1.0 µm, while the second width "W2", which is the width of the taper portion 12aa at its outside end and the width of the bending structure portion 12ab, is set at 0.3 µm. A length "L" of the taper portion 12aa is set at 300.0 µm. A curvature radius "R" of the bending structure portion 12ab, which is shown in FIG. 3B, is set at 3.0 µm, while an angular range "θ" of the bending structure portion 12ab is set at 120°. In addition, as shown in FIGS. 4A and 4B, the thickness "T" of the first optical waveguide 12 including the terminator 12a is set at 0.4 µm.

A refractive index "n" of SiN is 1.967, while a refractive index "n" of SiO$_2$ is 1.444. An effective index of the first optical waveguide 12 made of SiN and the under-clad layer 32 as well as the over-clad layer 34 made of SiO$_2$ varies depending on a cross-sectional area of SiN. In a case shown in FIG. 4A that the first width "W1" is 1.0 µm and the thickness "T" is 0.4 µm, the effective index becomes 1.61684. In a case shown in FIG. 4B that the second width "W2" is 0.3 µm and the thickness "T" is 0.4 µm, the effective index becomes 1.45163.

The effective index is an index for indicating strength of the optical confinement. When the effective index is high and a difference between the effective index and the refractive index of the clad material becomes larger, the optical confinement becomes a strong confinement condition. The light can be hardly discharged from the optical waveguide to the clad layer in such strong confinement condition. On the other hand, when the effective index is low and the difference between the effective index and the refractive index of the clad material becomes smaller (that is, the effective index is a value close to the refractive index of the clad material), the optical confinement becomes a weak confinement condition. The light can be easily discharged from the optical waveguide to the clad layer in such weak confinement condition. When the taper portion 12aa is provided, it is possible to make the effective index at the outside end of the taper portion 12aa closer to the refractive index of the clad material and it is thereby possible to produce the weak confinement condition. Then, the light can be easily discharged to the clad layer.

However, in a case that the terminator 12a has only the taper portion 12aa, the light is slightly but inevitably reflected at the outside end of the taper portion 12aa, because the minimum width is decided by the restrictions of the semiconductor process. Even such a small reflection of the light cannot be negligible in the terminator for the laser resonator, such as, the laser light source. The slight reflection of the light may cause an unintentional oscillation. According to the terminator 12a of the present embodiment, however, the bending structure portion 12ab is provided in addition to the taper portion 12aa. Therefore, it is possible to discharge the light without generating the unnecessary reflection of the light in the bending structure portion 12ab. A mechanism for achieving the above effect will be explained hereinafter with reference to FIGS. 5A, 5B, 6A, 6B and 7.

Figure 5A:
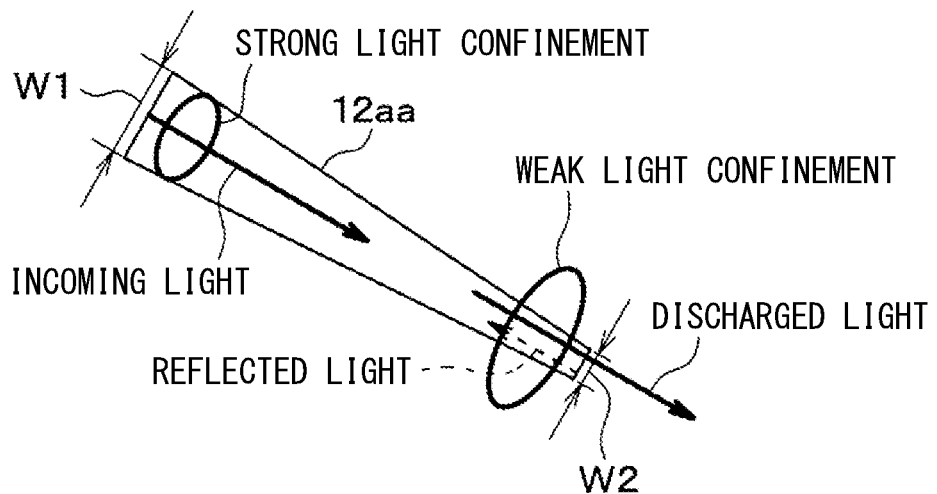
FIG. 5A is a schematic view showing a condition of light confinement in a case that the terminator is simply formed by a taper portion.

FIG. 5A shows a schematic view for the structure of the terminator 12a, which corresponds to a structure of the terminator of the prior art and which only includes the taper portion 12aa. In the terminator 12a of FIG. 5A, the width of the waveguide is changed in the taper portion 12aa from the first width "W1" to the second width "W2", that is, from a larger width to a smaller width. According to such a structure, the strong confinement condition of the light, in which the width of the waveguide is larger, is changed to the weak confinement condition of the light, in which the width of the waveguide is smaller. Then, the light is discharged to some extent at the outside end of the taper portion 12aa. Since a flat portion is inevitably formed at the outside end of the taper portion 12aa, at which the waveguide width is minimized, the effective index is changed in a discontinuous manner and the light is thereby even slightly reflected.

Figure 6A:
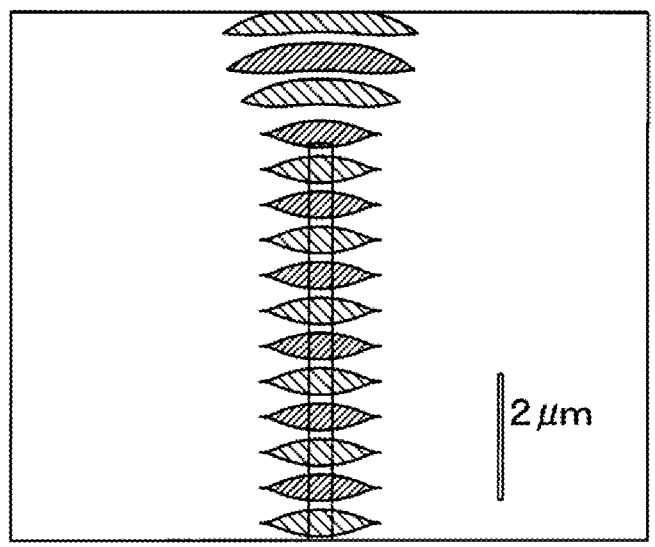
FIG. 6A is a schematic view showing analyzed results, wherein light condition in the structure of FIG. 5A is analyzed by FDTD (Finite-Difference Time-Domain) method.

FIG. 6A is a view for schematically showing analyzed results, wherein the light condition in the structure of FIG. 5A is analyzed by FDTD (Finite-Difference Time-Domain) method. As shown in FIG. 6A, the light is discharged only at the outside end of the taper portion 12aa. An optical intensity of the reflected light, which returns to a position separated from the outside end of the taper portion 12aa and different from an incident position, is measured to calculate a reflection ratio, which is a ratio of the optical intensity of the reflected light with respect to the optical intensity of the incident light. The calculated reflection ratio was $1.7 \times 10^{-4}$. It is preferable that the reflection ratio for the reflected light generated in the laser resonator is smaller than $5 \times 10^{-5}$. When compared the reflection ratio ($1.7 \times 10^{-4}$) in the structure of FIG. 5A with the preferable reflection ratio (a value less than $5 \times 10^{-5}$), the reflection ratio in the structure of FIG. 5A is larger than $5 \times 10^{-5}$. Therefore, the reflection of the light in the structure of FIG. 5A cannot be negligible. The unintentional oscillation may occur in the structure of FIG. 5A.

Figure 5B:
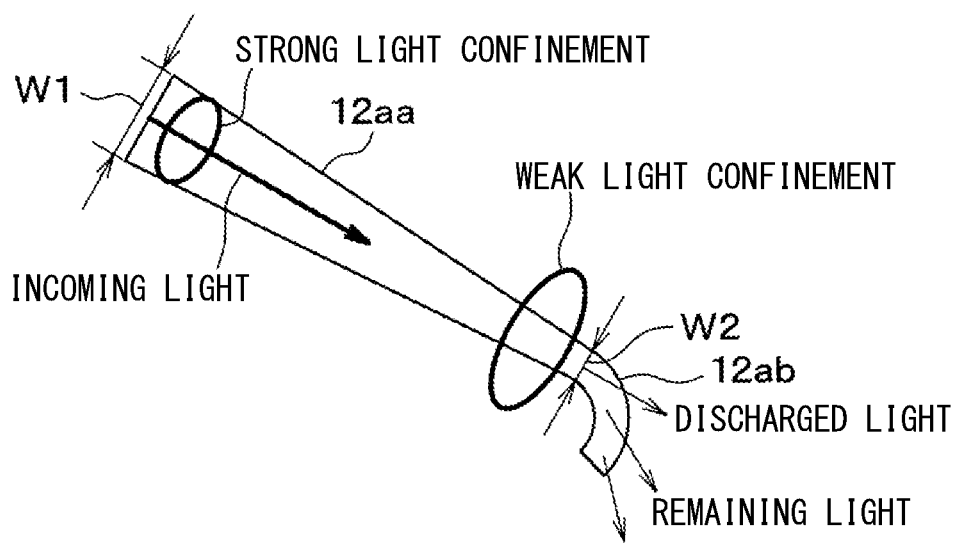
FIG. 5B is a schematic view showing a condition of light confinement in a case that the terminator has a structure according to the first embodiment, that is, the terminator has a taper portion and a bending structure portion.

According to the structure of the present embodiment shown in FIG. 5B, the terminator 12a has not only the taper portion 12aa but also the bending structure portion 12ab. Therefore, it is possible to avoid the situation that the effective index is changed in the discontinuous manner at the outside end of the taper portion 12aa (that is, at a boundary between the taper portion 12aa and the bending structure portion 12ab). Namely, the effective index is changed in a continuous manner by the bending structure portion 12ab formed at the outside end of the taper portion 12aa. According to the above structure, it is possible to suppress the reflection of the light. Since the bending structure portion 12ab has a sharp bending structure, which extends from the taper portion 12aa of a straightly extending shape, a large amount of the light is discharged at a bending start position (the boundary between the taper portion 12aa and the bending structure portion 12ab). In addition, remaining light, which is not discharged at the bending start position, is gradually discharged by the bending structure portion 12ab. As a result, since little amount of the light reaches at the forward end of the bending structure portion 12ab and most of the light is discharged halfway, there is little reflection of the light at the forward end of the bending structure portion 12ab.

Figure 6B:
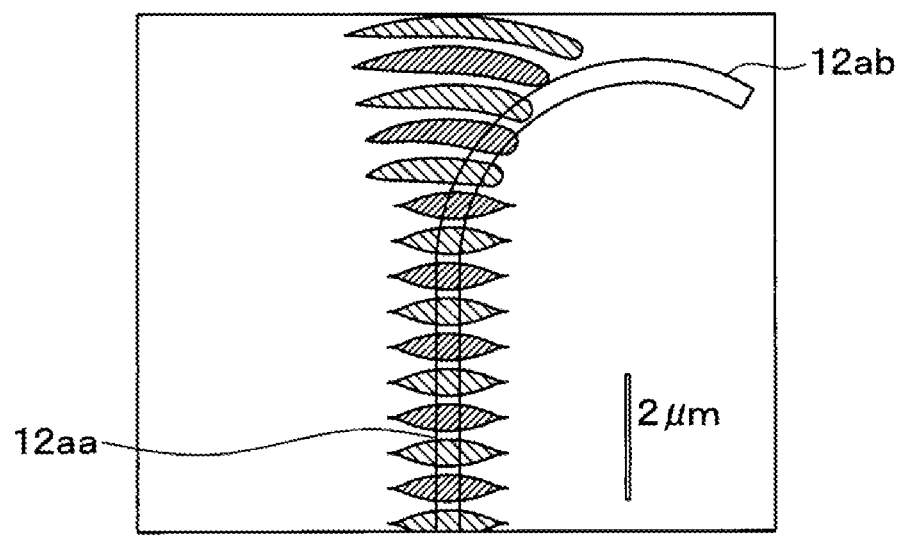
FIG. 6B is a schematic view showing analyzed results, wherein light condition in the structure of FIG. 5B is analyzed by FDTD method.

FIG. 6B is a view for schematically showing analyzed results, wherein the light condition in the structure of FIG. 5B is analyzed by FDTD (Finite-Difference Time-Domain) method. As shown in FIG. 6B, a larger amount of the light is discharged at the outside end of the taper portion 12aa and the light is continuously discharged thereafter in the bending structure portion 12ab. The optical intensity of the reflected light is measured to calculate the reflection ratio in the same manner to that of FIG. 6A. The calculated reflection ratio was $7.4 \times 10^{-6}$. In the structure of FIG. 5B, the reflection ratio is made to be sufficiently smaller than $5 \times 10^{-5}$ and thereby it is possible to suppress the reflection of the light to a negligible extent. In other words, it is possible to avoid the situation that the unintentional oscillation is generated by the reflected light.

Figure 7:
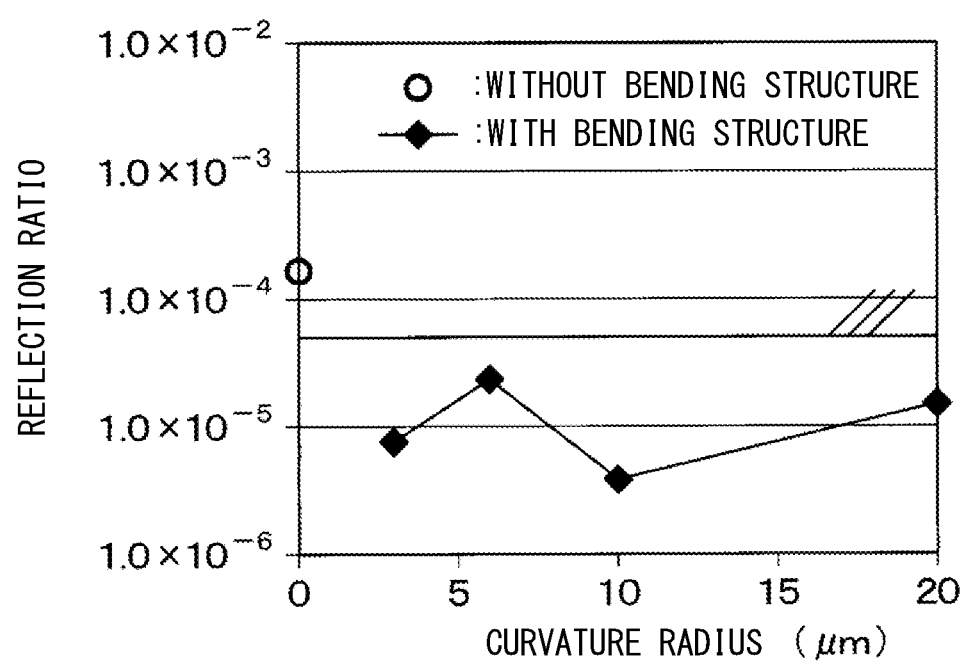
FIG. 7 is a graph showing a reflection ratio when curvature radius of the bending structure portion is changed.

In the present embodiment, the curvature radius "R" is set at 3.0 µm. However, the curvature radius "R" may be optionally set at any other value. FIG. 7 is a graph showing the reflection ratio when the curvature radius "R" is changed. The reflection ratio for the structure of FIG. 5A is also indicated in FIG. 7. As shown in FIG. 7, the reflection ratio can be made to become smaller than $5 \times 10^{-5}$, when the curvature radius "R" is larger than 3.0 µm. In a range of the curvature radius "R" between 3.0 µm and 20 µm, for which simulation has been done, the reflection ratio can be made to be smaller than $5 \times 10^{-5}$. The curvature radius "R" may be smaller than 3.0 µm. However, when the curvature radius "R" is too small, it becomes difficult to form the arc shape. Therefore, the simulation was done only for the cases, in which the curvature radius "R" is larger than 3.0 µm.

As above, when the terminator 12a includes the taper portion 12aa and the bending structure portion 12ab, the light is discharged at the outside end of the taper portion 12aa (at the boundary between the taper portion 12aa and the bending structure portion 12ab) and the remaining light is further discharged in the continuous manner in the bending structure portion 12ab. It is thereby possible to make the amount of the reflected light to be almost zero and it is possible to avoid the situation that the unintentional oscillation is generated by the reflected light. In addition, since it is possible to suppress the unnecessary reflection of the light by providing the bending structure portion 12ab at the outside end of the taper portion 12aa, it becomes possible to make smaller the size of the terminator 12a, the optical filter and the laser light source having the terminator 12a.

Figure 8A:
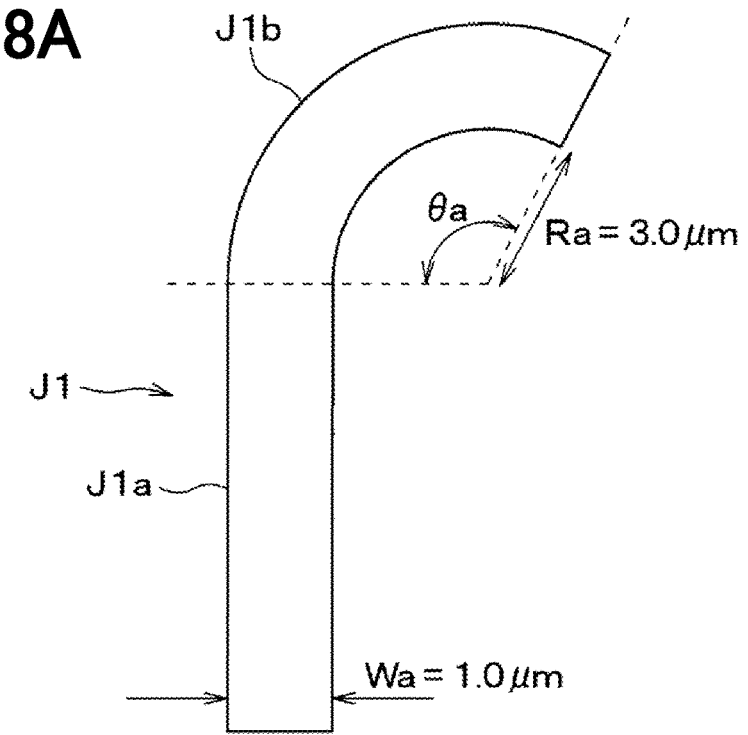
FIG. 8A is a schematic plan view showing a comparative example, wherein each of a straight portion and a spiral portion of the optical waveguide has the same waveguide width to each other.

The structure of the present embodiment, in which the terminator 12a includes the taper portion 12aa and the bending structure portion 12ab, will be further compared with a structure of a comparative example shown in FIG. 8A, in which a spiral portion J1b is provided at a longitudinal end of an inside straight portion J1a, wherein the spiral portion J1b has a constant waveguide width for its entire length. The taper portion is not formed in the comparative example between the spiral J1b and the inside straight portion J1a (the main waveguide portion) of the optical waveguide.

In the comparative example of FIG. 8A having the spiral portion J1b, the inside straight portion J1a of the optical waveguide J1 has a constant width along its longitudinal direction and the spiral portion J1b having the constant width, which is the equal to the waveguide width of the inside straight portion J1a, along its curved direction. A simulation is done for the optical waveguide J1 shown in FIG. 8A. In the optical waveguide J1, the inside straight portion J1a thereof has the constant width along its longitudinal direction and the spiral portion J1b (the bending structure portion J1b) having the same shape to the bending structure portion 12ab of the present embodiment is provided at the longitudinal end of the inside straight portion J1a. A width "Wa" of the optical waveguide J1 is set at 1.0 μm, which is equal to the first width "W1" of the first optical waveguide 12 of the present embodiment. A curvature radius "Ra" is set at 3.0 μm. An angular range "ea" of the bending structure portion J1b is set at 120°.

Figure 8B:
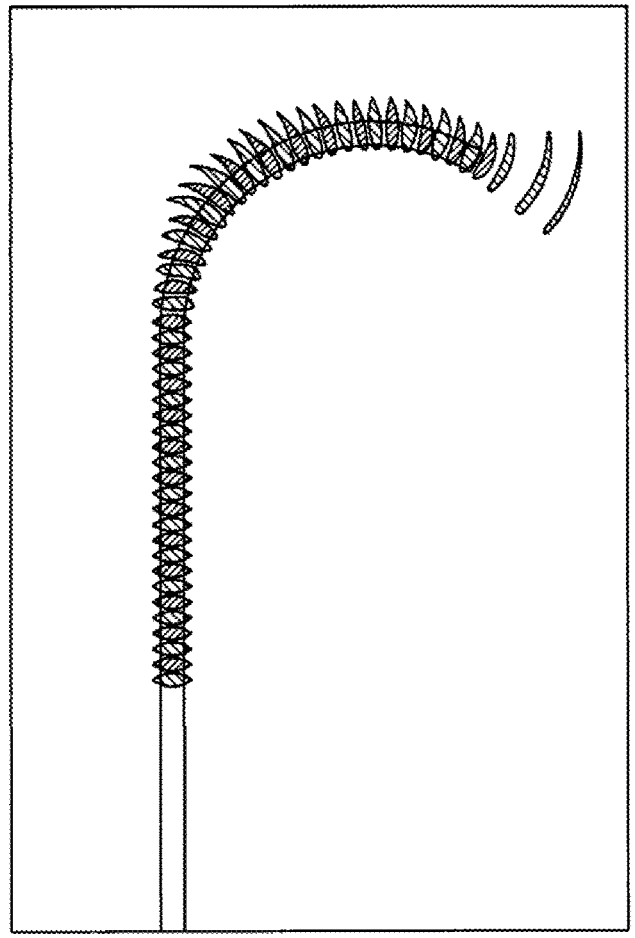
FIG. 8B is a schematic view showing analyzed results, wherein light condition in the structure of FIG. 8A is analyzed by FDTD method.

FIG. 8B is a view schematically showing analyzed results, in which the condition of the light in the structure of FIG. 8A is analyzed by the FDTD method. As shown in FIG. 8B, it is confirmed that little amount of the light is discharged from the longitudinal end of the inside straight portion J1a. It is further confirmed that only a small amount of the light is discharged in the bending structure portion J1b. This is because the strength of the light confinement is constant in the inside straight portion J1a having no taper portion. In addition, the light reaches at the forward end of the bending structure portion J1b. Based on the above facts, it is considered that the light is reflected at the forward end of the bending structure portion J1b. The optical intensity of the reflected light is measured to calculate the reflection ratio in the same manner to that of FIG. 6A. The calculated reflection ratio was $8.9\times10^{-5}$. In other words, the reflection ratio in the structure of FIG. 8A is larger than $5\times10^{-5}$ and thereby it is not possible to sufficiently suppress the reflection of the light. According to the above simulation for the structure of FIG. 8A, it becomes apparent that it is necessary to form the spiral portion in a wider space in order to sufficiently suppress the reflection of the light. In other words, in the case of the above structure of FIG. 8A, an occupying space for the terminator (the spiral portion J1b) becomes larger and thereby the size of the optical filter as well as the size of the laser light source becomes larger.

On the other hand, according to the present embodiment, the taper portion 12aa is provided between the bending structure portion 12ab and the inside portion (the main waveguide portion) of the optical waveguide 12 to produce the weak condition of the light confinement and the bending structure portion 12ab is further provided at the outside end of the taper portion 12aa. As a result, it is possible to effectively and sufficiently suppress the reflection of the light even with the smaller occupying space of the terminator 12a.

The reflection ratio is further simulated by changing the curvature radius Ra in the structure of FIG. 8A. In addition, the reflection ratio is simulated by changing the curvature radius R in the structure of the present embodiment, wherein the second waveguide width "W2" for the outside end of the taper portion 12aa and for the bending structure portion 12ab is set at a value of 0.3 μm or 0.45 μm. In the case that the second waveguide width "W2" is 0.3 μm, the effective index becomes about 1.45. In the case that the second waveguide width "W2" is 0.45 μm, the effective index becomes about 1.49. Furthermore, the reflection ratio is simulated for the structure having no terminator and the structure having only the taper portion 12aa. The results of those simulations are shown in FIG. 9.

Figure 9:
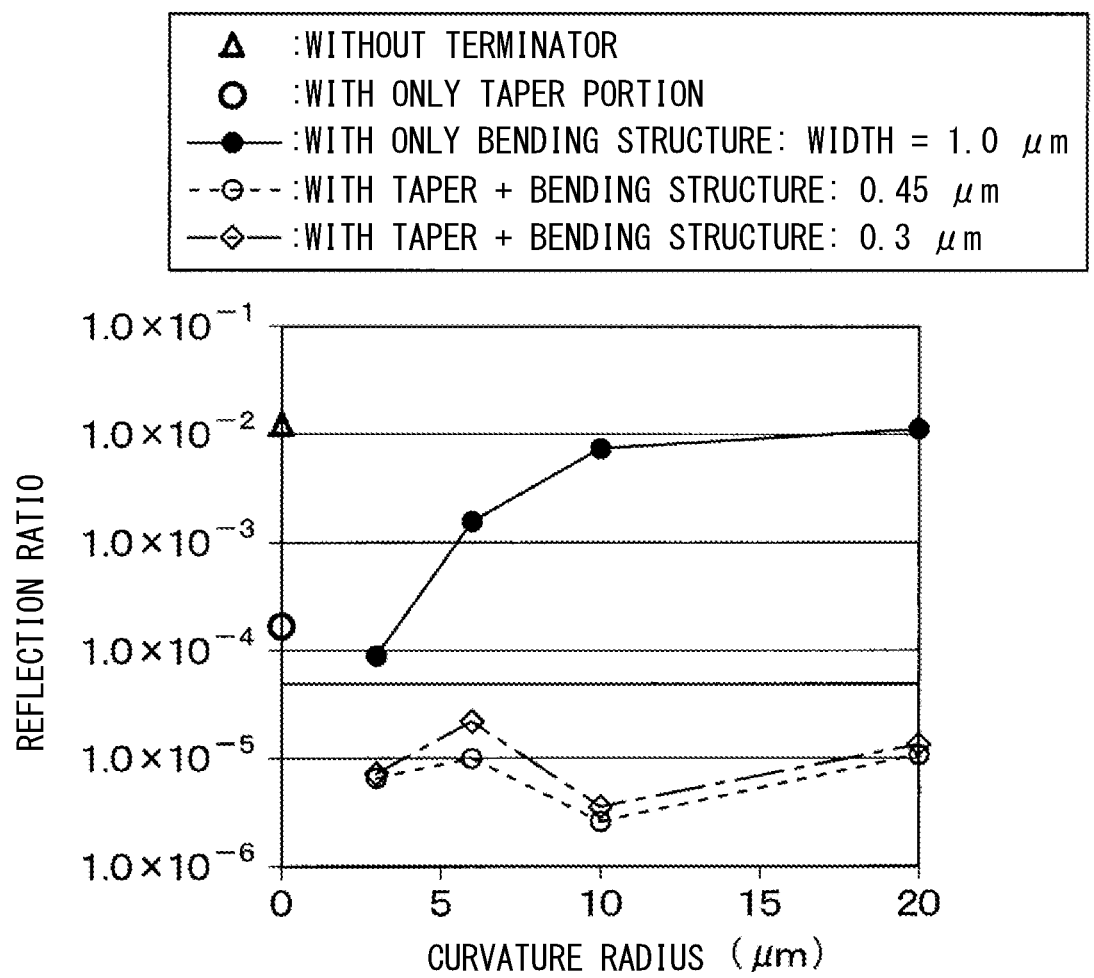
FIG. 9 is a graph showing reflection ratios in a case that various kinds of terminators are provided and a reflection ratio in a case that no terminator is provided.

As shown in FIG. 9, the reflection ratio can be made smaller than $5\times10^{-5}$ in each of the cases in which the terminator has both of the taper portion and the bending structure portion, and the second waveguide width "W2" is set at the value of 0.3 μm and at the value of 0.45 μm. On the other hand, in the structure of FIG. 8A having no taper portion, the reflection ratio is larger than $5\times10^{-5}$ independently of the curvature radius Ra. In addition, in each of the cases in which no terminator is provided or only the taper portion is provided in the terminator, the reflection ratio is larger than $5\times10^{-5}$. As understood from those simulation results, the reflection ratio having the small value (smaller than $5\times10^{-5}$) can be obtained in the structure of the present embodiment, in which the bending structure portion 12ab is provided at the outside end of the taper portion 12aa.

As above, in the present embodiment, the terminator 12a has the taper portion 12aa and the bending structure portion 12ab. According to the above structure, most of the light can be discharged at the boundary portion between the taper portion 12aa and the bending structure portion 12ab, and the light can be further discharged in the bending structure portion 12ab in the continuous manner. It is therefore possible in the present embodiment to prevent by the terminator 12a the generation of the unnecessary reflection of the light and to prevent the generation of the unnecessary oscillation by the reflected light. Since the above effects can be obtained by a simple structure of the bending structure portion 12ab provided at the outside end of the taper portion 12aa, it is possible to reduce the size of the terminator 12a, the optical filter or the laser light source having the terminator 12a.

The laser light source can be applied to an optical transmitter-receiver having the laser light source like a laser-radar device for an automotive vehicle. The optical transmitter-receiver emits the external outgoing light having a specific wavelength from the laser light source. The optical transmitter-receiver receives a reflected light, when the outgoing light comes in collision with an obstacle and it is reflected at the obstacle. The optical transmitter-receiver measures a distance to the obstacle based on the reflected light.

Figure 10:
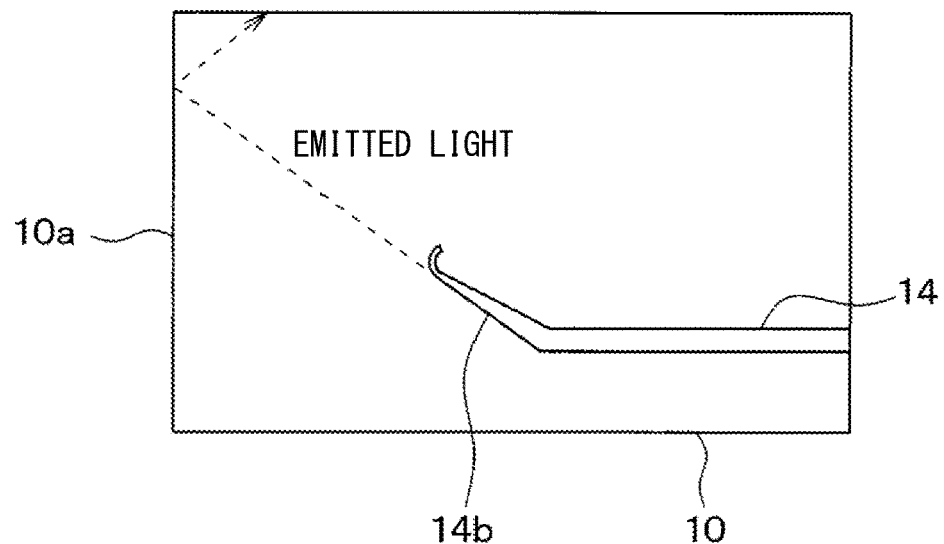
FIG. 10 is a schematic view showing a direction of an emitted light and a reflected light in a case that a terminator has a bending structure portion in each of the optical waveguides.

In the present embodiment, each of the terminators 12a, 14a, 14b and 16a has such a structure, according to which each terminator is bent to the respective inside portion of the optical waveguide and each terminator is inclined to the end surface 10a of the semiconductor substrate 10 for the optical filter 1. As shown in FIG. 10, even when the light emitted from each of the terminators 12a, 14a, 14b and 16a is reflected at the end surface 10a of the semiconductor substrate 10, such reflected light does not return to the respective terminators 12a, 14a, 14b and 16a. As a result, it is possible to avoid a situation that an unnecessary light enters again the optical waveguide 12, 14 or 16. In other words, it is possible to avoid a situation that an operation of the optical filter 1 may be adverse affected by return of the reflected light.

FURTHER EMBODIMENTS AND/OR MODIFICATIONS

The present disclosure is not limited to the above embodiment but can be further modified in various manners without departing from a spirit of the present disclosure.

For example, each of the first waveguide width "W1" and the second waveguide width "W2" may be set at any optional values. In particular, the second waveguide width "W2" may be set at any value, so long as the weak condition of the light confinement is produced and thereby the reflection ratio becomes sufficiently small. As explained above, in the case that the second waveguide width "W2" for the outside end of the taper portion 12aa and for the bending structure portion 12ab is set at the value of 0.45 μm, the reflection ratio can be made to become sufficiently small. Therefore, when the second waveguide width "W2" is set at a value smaller than 0.45 μm, the same effect of the first embodiment can be obtained. With respect to the effective index, it is possible to produce the weak condition of the light confinement in which the small reflection ratio can be obtained, when the effective index with the clad material is smaller than 0.05. The angular range "8" of the bending structure portion 12ab is not limited to 120°, but the angular range "8" can be optionally set at any other value.

In the above embodiment, the terminator 12a, which forms the end device of the optical waveguide, is composed of the taper portion 12aa and the bending structure portion 12ab. The present disclosure is not limited to such a structure of the terminator 12a. it is only required for the taper portion 12aa that it works as a converting portion, which converts from the strong condition of the light confinement to the weak condition of the light confinement. In other words, it is required for the converting portion that the effective index is gradually decreased in the direction to the outside end of the waveguide. In addition, in the above embodiment, the terminator is inclined to the inner straight portion of the optical waveguide. However, it is not always necessary to incline the terminator with respect to the inner straight portion.

Figure 11:
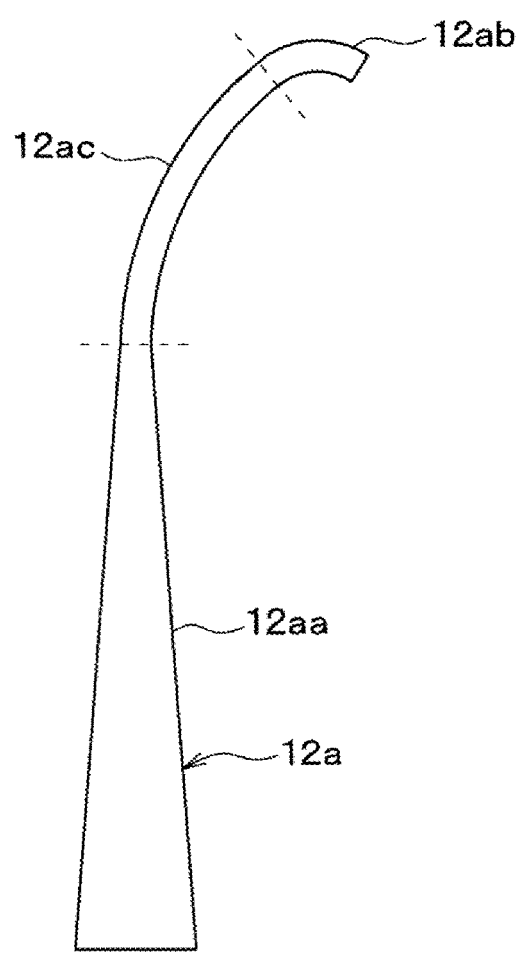
FIG. 11 is a schematic upper-side view in a case that an intermediate extension portion is provided between the taper portion and the bending structure portion.

In the above embodiment, the bending structure portion 12ab is provided at the outside end of the taper portion 12aa in such a way that the bending structure portion 12ab extends directly from the taper portion 12aa in a continuous manner. However, as shown in FIG. 11, an intermediate extension portion 12ac may be provided between the taper portion 12aa and the bending structure portion 12ab, wherein the intermediate extension portion 12ac has a waveguide width which is the same to that of the outside end of the taper portion 12aa. The intermediate extension portion 12ac is gently curved, so that a direction of the light can be changed in the intermediate extension portion 12ac. The light is discharged by and at the bending structure portion 12ab, which is connected to an end of the intermediate extension portion 12ac.

Figure 12:
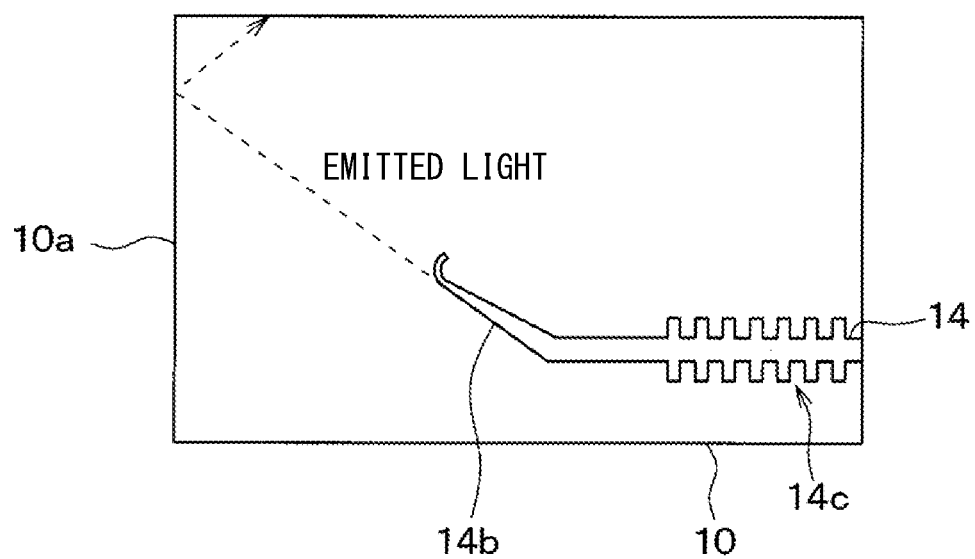
FIG. 12 is a schematic upper-side view showing the optical waveguide, for which diffraction gratings are provided in addition to the terminator, and showing a direction of an emitted light and a reflected light.

The terminator of the present disclosure may be provided to a diffraction grating. In a case that the terminator is provided to the diffraction grating, the light, which has not been discharged by the diffraction grating to the outside, can be discharged to the outside without returning the light back to the diffraction grating. FIG. 12 shows an example, according to which not only a terminator 14b but also a diffraction grating 14c is provided in the second optical waveguide 14. It is also preferable that the terminator 14b is inclined to the second optical waveguide 14, even in the case that the diffraction grating 14c is provided to the second optical waveguide 14. In the case that the diffraction grating 14c is provided to the second optical waveguide 14, a possible adverse effect, which may be caused by a reflected light of an emitted light from the terminator 14b, should be taken into consideration. When the terminator 14b is inclined to the second optical waveguide 14 having the diffraction grating 14c, it is possible to suppress the adverse effect applied to the operation of the optical filter, because the return of the reflected light can be suppressed. Although the example is shown in FIG. 12, in which the terminator 14b and the diffraction grating 14c are provided for the second optical waveguide 14, the terminator and the diffraction grating can be provided for the first and/or the third optical waveguides 12 and 16.

What is claimed is:

1. An end device for an optical waveguide, which is formed on a semiconductor substrate and surrounded by a clad layer, wherein the end device is provided at a longitudinal end of a main waveguide portion of the optical waveguide, comprising:
   a converting portion for converting a condition of light confinement from a strong condition to a weak condition in a direction to an outside end of the converting portion;
   a bending structure portion connected to the outside end of the converting portion and formed in an arc shape on a plane parallel to a surface of the semiconductor substrate; and
   an intermediate extension portion formed between the converting portion and the bending structure portion for changing a direction of light transmitted from the converting portion,
   the bending structure portion being connected to the outside end of the converting portion through the intermediate extension portion,
   wherein the converting portion is formed in a taper shape having a first waveguide width and a second waveguide width, wherein the second waveguide width is smaller than the first waveguide width and a waveguide width of the converting portion is gradually decreased from the first waveguide width to the second waveguide width in a direction from the longitudinal end of the main waveguide portion to the outside end of the converting portion, and
   wherein the intermediate extension portion has a larger curvature radius than the bending structure portion.

2. The end device for the optical waveguide according to claim 1, wherein
   the second waveguide width is smaller than 0.45 μm.

3. The end device for the optical waveguide according to claim 1, wherein
   an effective index formed by the clad layer and a waveguide portion of the converting portion is decreased in the direction to the outside end of the converting portion, so that the effective index becomes closer to a refractive index of the clad layer.

4. The end device for the optical waveguide according to claim 1, wherein
the optical waveguide is composed of silicon nitride film,
the clad layer is composed of silicon dioxide film,
the effective index formed by the clad layer and the waveguide portion of the converting portion is smaller than 1.49, when the condition of the light confinement is in the weak condition.

5. The end device for the optical waveguide according to claim 1, wherein the converting portion is inclined to an end surface of the semiconductor substrate.

6. The end device for the optical waveguide according to claim 5, wherein the bending structure portion has a curvature radius in a range of between 3.0 μm and 20 μm.

7. The end device for the optical waveguide according to claim 1, wherein the bending structure portion has a constant waveguide width for its entire length.

8. An optical filter having the end device of claim 1 as a terminator, comprising:
a first ring resonator;
a second ring resonator having a boundary length, which is different from a boundary length of the first ring resonator; and
a first waveguide portion, which is optically coupled to the first ring resonator and transmits light to the first ring resonator,
wherein the light entering the first waveguide portion is transmitted to the second ring resonator via the first ring resonator, and
wherein the end device is formed at the longitudinal end of the first waveguide portion.

9. The end device for the optical waveguide according to claim 1, further configured such that the intermediate extension portion changes a direction of the light, and the light is discharged at the bending structure portion.

10. An end device for an optical waveguide, which is formed on a semiconductor substrate and surrounded by a clad layer, wherein the end device is provided at a longitudinal end of a main waveguide portion of the optical waveguide, comprising:
a converting portion for converting a condition of light confinement from a strong condition to a weak condition in a direction to an outside end of the converting portion;
a bending structure portion connected to the outside end of the converting portion and formed in an arc shape on a plane parallel to a surface of the semiconductor substrate; and
an intermediate extension portion formed between the converting portion and the bending structure portion for changing a direction of light transmitted from the converting portion,
the bending structure portion being connected to the outside end of the converting portion through the intermediate extension portion,
wherein the converting portion is formed in a taper shape having a first waveguide width and a second waveguide width, wherein the second waveguide width is smaller than the first waveguide width and a waveguide width of the converting portion is gradually decreased from the first waveguide width to the second waveguide width in a direction from the longitudinal end of the main waveguide portion to the outside end of the converting portion, and
wherein the bending structure portion has a curvature radius in a range of between 3.0 μm and 20 μm.

11. The end device for the optical waveguide according to claim 10, wherein
the second waveguide width is smaller than 0.45 μm.

12. The end device for the optical waveguide according to claim 10, wherein
an effective index formed by the clad layer and a waveguide portion of the converting portion is decreased in the direction to the outside end of the converting portion, so that the effective index becomes closer to a refractive index of the clad layer.

13. The end device for the optical waveguide according to claim 10, wherein
the optical waveguide is composed of silicon nitride film,
the clad layer is composed of silicon dioxide film,
the effective index formed by the clad layer and the waveguide portion of the converting portion is smaller than 1.49, when the condition of the light confinement is in the weak condition.

14. The end device for the optical waveguide according to claim 10, wherein the converting portion is inclined to an end surface of the semiconductor substrate.

15. The end device for the optical waveguide according to claim 10, wherein the bending structure portion has a constant waveguide width for its entire length.

16. The end device for the optical waveguide according to claim 10, wherein the intermediate extension portion has a larger curvature radius than the bending structure portion.

17. The end device for the optical waveguide according to claim 16, further configured such that the intermediate extension portion changes a direction of the light, and the light is discharged at the bending structure portion.

* * * * *